(12) United States Patent
Kamitani

(10) Patent No.: US 9,476,579 B2
(45) Date of Patent: Oct. 25, 2016

(54) RELAY CONNECTOR AND LIGHT SOURCE MODULE PROVIDED WITH SAME

(71) Applicant: SHARP KABUSHIKI KAISHA, Osaka-shi, Osaka (JP)

(72) Inventor: Shingo Kamitani, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/387,725

(22) PCT Filed: Apr. 12, 2013

(86) PCT No.: PCT/JP2013/061082
§ 371 (c)(1),
(2) Date: Sep. 24, 2014

(87) PCT Pub. No.: WO2013/157497
PCT Pub. Date: Oct. 24, 2013

(65) Prior Publication Data
US 2015/0049485 A1  Feb. 19, 2015

(30) Foreign Application Priority Data
Apr. 17, 2012  (JP) .................................. 2012-093683

(51) Int. Cl.
| | | |
|---|---|---|
| *F21V 23/06* | (2006.01) | |
| *G02F 1/1335* | (2006.01) | |
| *F21V 19/00* | (2006.01) | |
| *H01R 31/06* | (2006.01) | |
| *H01L 33/48* | (2010.01) | |
| *F21Y 101/02* | (2006.01) | |
| *F21Y 103/00* | (2016.01) | |

(52) U.S. Cl.
CPC ........... *F21V 23/06* (2013.01); *F21V 19/0025* (2013.01); *G02F 1/133603* (2013.01); *H01R 31/06* (2013.01); *F21Y 2101/02* (2013.01); *F21Y 2103/003* (2013.01); *G02F 2001/133612* (2013.01); *H01L 33/486* (2013.01); *H01L 2224/48091* (2013.01); *H01L 2224/48137* (2013.01)

(58) Field of Classification Search
CPC ............ H01L 2224/4841; H01L 2924/00014; H01L 2224/48091; H01L 2224/48137; H01L 33/486; F21V 23/06; F21V 19/0025; H01R 31/06; G02F 1/133603; G02F 2001/133612; F21Y 2101/02; F21Y 2103/003
See application file for complete search history.

(56) References Cited

U.S. PATENT DOCUMENTS

| | | | | |
|---|---|---|---|---|
| 6,906,414 B2 * | 6/2005 | Zhao | ........................ | H01L 23/13 257/706 |
| 7,806,558 B2 * | 10/2010 | Williamson | .......... | F21V 7/0091 362/237 |

(Continued)

FOREIGN PATENT DOCUMENTS

| | | |
|---|---|---|
| CN | 101681052 A | 3/2010 |
| JP | 2010-198993 A | 9/2010 |

(Continued)

*Primary Examiner* — Sharon Payne
(74) *Attorney, Agent, or Firm* — Birch, Stewart, Kolasch & Birch, LLP

(57) ABSTRACT

A relay connector that is interposed between two substrates provided with mutually connectable connecting parts and that indirectly connects the two substrates, wherein the relay connector is provided with a first connecting part capable of mechanistically connecting to the connecting part of one of the substrates, and a second connecting part capable of mechanistically connecting to the connecting part of the other substrate.

8 Claims, 6 Drawing Sheets

(56) References Cited

U.S. PATENT DOCUMENTS

| | | | |
|---|---|---|---|
| 2010/0103651 A1* | 4/2010 | Park | H05K 1/142 362/97.1 |
| 2012/0044668 A1 | 2/2012 | Takeuchi | |
| 2012/0087126 A1 | 4/2012 | Takeuchi et al. | |

FOREIGN PATENT DOCUMENTS

| | | |
|---|---|---|
| JP | 2010-225385 A | 10/2010 |
| JP | 2010-278426 A | 12/2010 |
| JP | 2011-34956 A | 2/2011 |
| JP | 2012-28043 A | 2/2012 |

* cited by examiner

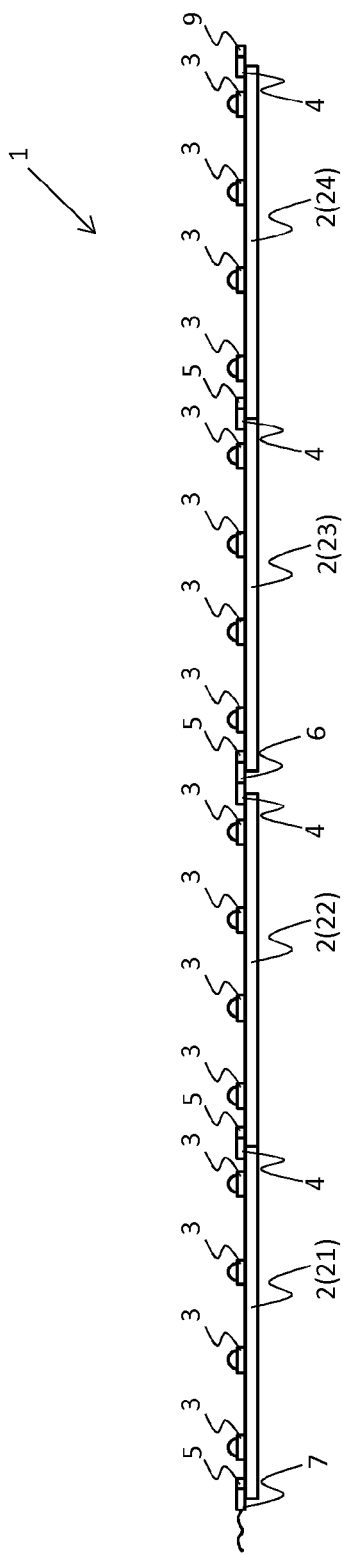
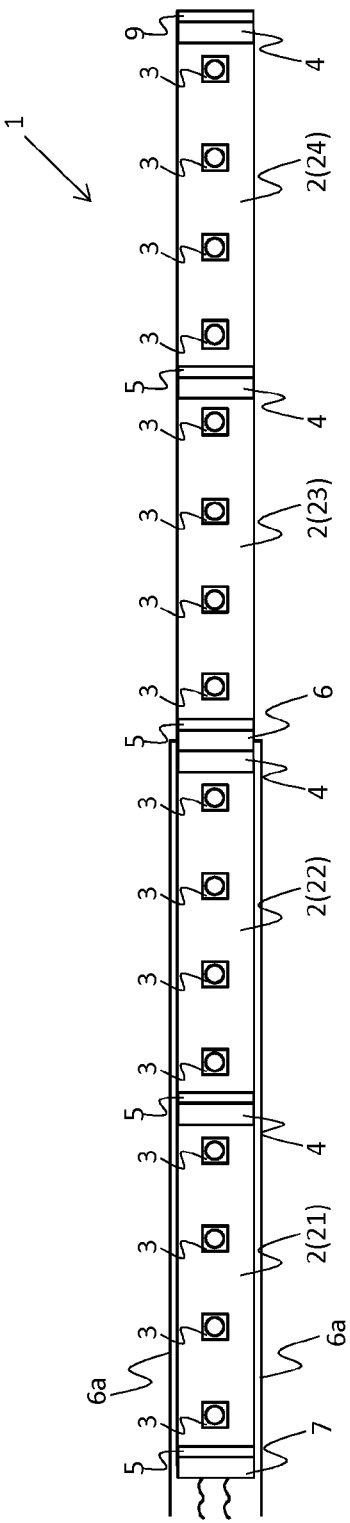
Fig.01
Fig.02

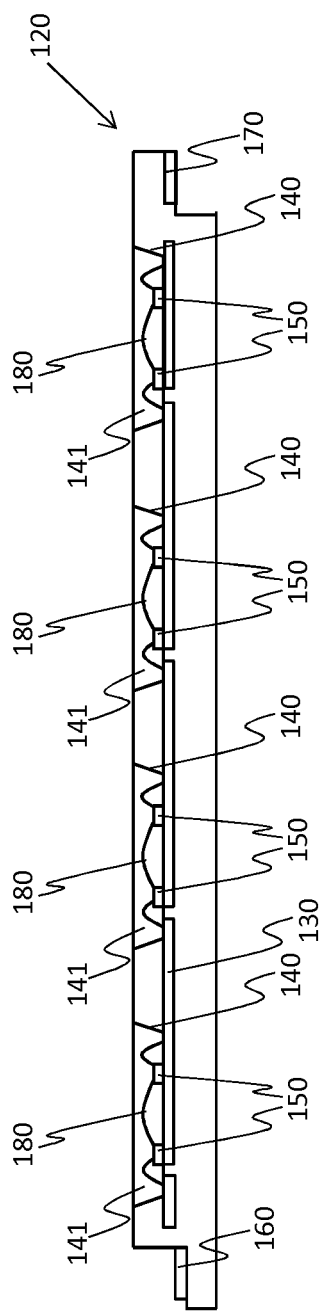
Fig.07
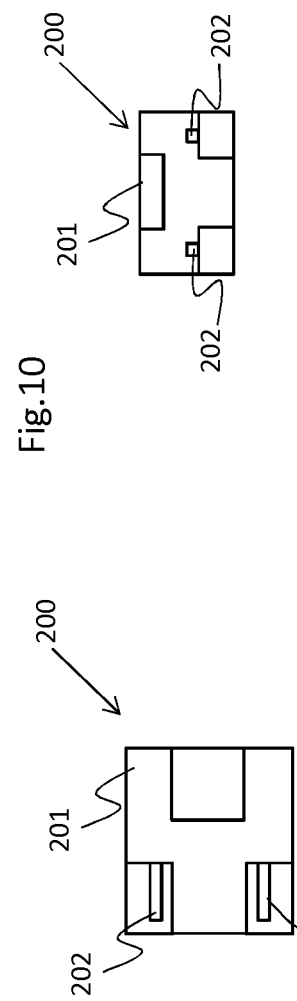
Fig.08
Fig.10
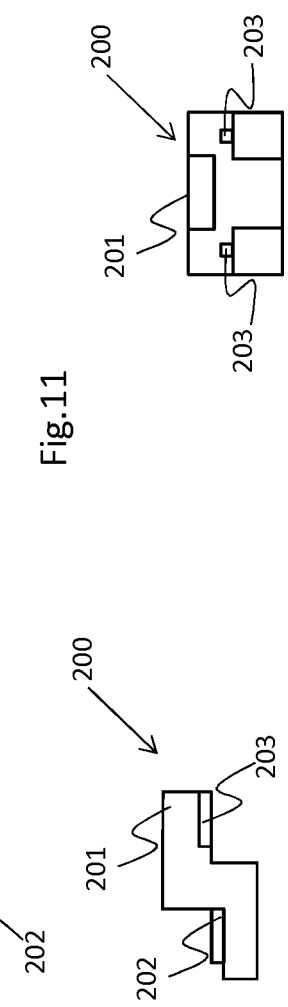
Fig.09
Fig.11

RELAY CONNECTOR AND LIGHT SOURCE MODULE PROVIDED WITH SAME

TECHNICAL FIELD

The present invention relates to a relay connector for coupling together a plurality of circuit boards on which light-emitting elements are mounted, and to a light source module provided with such a relay connector.

BACKGROUND ART

Today, light-emitting elements (LEDs) are widely used as light sources in light source modules for use in liquid crystal display devices and lighting devices.

In liquid crystal display devices, a method of backlighting in which light from a light source module is shone on a liquid crystal layer from behind is quite common. There are roughly two methods of backlighting: in edge-lit backlighting, a light source module is arranged in a row along one or more of the top, bottom, left side, and right side of a light guide plate arranged directly behind a liquid crystal layer; in direct-lit backlighting, a light source module is arranged directly behind a liquid crystal layer. With either method, a large number of LEDs are needed to obtain a sufficient amount of light as a backlight. Also in use as a lighting device, a large number of LEDs are needed to obtain a sufficient amount of light as a lighting device.

In cases where a large number of LEDs are needed. LEDs are often spread among, and mounted on a plurality of circuit boards in other words, a light source module is composed of a combination of a plurality of circuit boards each having a plurality of LEDs mounted thereon. In liquid crystal display devices, the number of LEDs needed increases with the screen size. Thus, large-screen liquid crystal display devices (for example, those installed outdoors for large-screen digital signage) require a large number of LEDs, and require an accordingly large number of circuit boards on which to mount LEDs.

Adopting a design where a plurality of LEDs are driven separately for each circuit board leads to an increased number of power supply conductors, and hence a complicated wiring and cabling layout. To lessen the trouble, it is common to adopt a method in which a plurality of circuit boards are mechanically and electrically coupled together to form a channel (set) so that a plurality of LEDs are driven together for each such channel (see, for example Patent Document 1 identified below). A plurality of circuit hoards can be electrically coupled together, roughly speaking, in one of two electrical circuit configurations: a serially-connected and a parallel-connected configuration.

With a serially-connected configuration, the larger the number of circuit boards coupled together, the higher the voltage involved. This may pose problems in terms of product safety and the withstand voltage of components in the light source module. On the other hand, with a parallel-connected configuration, the larger the number of circuit boards coupled together, the higher the current that passes through an LED string when a defect occurs such that part of the LED string is short-circuited, possibly leading to smoking or ignition. Moreover, if a defect occurs such that part of an LED string remains open, although it has to be detected based on a change in voltage drop, the change in voltage drop is so small that it is difficult to accurately discriminate whether the change in voltage drop is ascribable to a mere measurement error or an open defect.

For these reasons, in a case where a large number of circuit boards are combined together, it is preferable to minimize the number of circuit boards that together form one channel (that are electrically coupled together).

LIST OF CITATIONS

Patent Literature

JP-A-2012-28043

SUMMARY OF THE INVENTION

Technical Problem

For a given number of circuit boards, the smaller the number of circuit boards forming one channel, the larger the number of channels. Since each channel is driven separately, different channels have to be electrically uncoupled from one another. As discussed above, mechanically coupling together circuit boards results in also electrically coupling them together, thus, mechanically coupling together circuit boards belonging to different channels results in also electrically coupling together the channels. Thus, for different channels to be electrically uncoupled from one another, they need to be also mechanically uncoupled from one another.

Inconveniently, an increase in the number of separately driven channels leads, due to, among others, an increase in the number of power supply conductors, to an increase in the size of the entire device, and also leads, due to an increase in the physical distance between channels, to uneven luminance and hence degraded quality.

An object of the present invention is to provide a relay connector that can mechanically couple together a plurality of circuit boards without losing safety and quality.

Means for Solving the Problem

To achieve the above object, according to one aspect of the present invention, a relay connector interposable between two circuit boards respectively having mutually coupleable coupling portions so as to indirectly couple together the two circuit boards is provided with: a first coupling portion mechanically coupleable to a coupling portion of one circuit board; and a second coupling portion mechanically coupleable to a coupling portion of the other circuit boards.

With this configuration, via the relay connector provided with the first coupling portion mechanically coupleable to the coupling portion of one circuit board and the second coupling portion mechanically coupleable to the coupling portion of the other circuit board, the two circuit boards can be indirectly coupled together. This helps prevent an unnecessary space from being left between the circuit boards.

In the relay connector configured as described above, preferably, there is further provided an electrical signal conducting member for input of an electrical signal from outside and/or for output of an electrical signal to outside.

With this configuration, since the relay connector is provided with the electrical signal conducting member, at the place where the circuit boards are coupled together, no extra electrical signal conducting member such as a harness plug is needed. That is, since the relay connector itself also serves as an electrical signal conducting member, no space is needed for an extra electrical signal conducting member.

In the relay connector configured as described above, preferably, even when the two circuit boards are indirectly and mechanically coupled together, the two circuit boards are electrically uncoupled from each other.

With this configuration, the two circuit boards can be indirectly and mechanically coupled together and simultaneously left electrically uncoupled from each other.

In the relay connector configured as described above, preferably, there is further provided, an engagement portion for positioning.

With this configuration, when the relay connector is built in a device having an engagement portion that engages with the engagement portion of the relay connector, the engagement portion of the relay connector engages with the engagement portion of the device. This allows easy positioning of the relay connector.

In the relay connector configured as described above, preferably, there is further provided a projecting portion for securing a gap against another member.

With this configuration, when, inside a device, the relay connector is placed opposite another member, the projecting portion produces a gap between the relay connector and the other member. Since the relay connector is for indirectly coupling together the two circuit boards, forming a predetermined gap between the relay connector and another member results in forming a predetermined gap between the circuit boards and the other member. This helps prevent damage to the circuit boards and to the light-emitting elements mounted on the circuit boards resulting from contact between the circuit boards and the other member.

In the relay connector configured as described above, preferably, the projecting portion comprises a first projecting portion and a second projecting portion formed apart from each other, parallel to the coupling direction of the two circuit boards.

With this configuration, since the projecting portion comprises the first and second projecting portions formed apart from each other, between the other member and the relay connector, their respective surfaces facing each other can be kept parallel to each other. Moreover, since the projecting portions (the first and second projecting portions) are formed parallel to the coupling direction of the two circuit boards, when light-emitting elements are mounted on the circuit boards coupled to the relay connector, the light emitted from the light-emitting elements can be prevented from leaking through a gap between the relay connector and the other member.

To achieve the above object, according to another aspect of the present invention, a light source module is provided with: a relay connector of any of the configurations described above; and two circuit boards having light-emitting elements mounted thereon and indirectly coupled together by the relay connector.

With this configuration, indirectly coupling together the two circuit boards via the relay connector reduces the physical distance between the circuit boards, and this eliminates unevenness in luminance. It is also possible to reduce the size of the light source module, and thus to reduce the size of an entire device incorporating the light source module.

In the relay connector configured as described above, preferably, the two circuit boards indirectly coupled together by the relay connector are light source circuit boards on which light-emitting elements are mounted by a COB method.

With this configuration, suitable applications are found even in light source circuit boards on which light-emitting elements are mounted by a COB method.

In the relay connector configured as described above, preferably, the light source circuit boards comprise a first projecting portion and a second projecting portion formed apart from each other across the light-emitting elements, parallel to the coupling direction of the two circuit boards.

With this configuration, the light source circuit boards are provided with the first and second projecting portions formed apart from each other, parallel to the coupling direction of the two circuit boards, so as to sandwich the light-emitting elements. This helps secure a gap between the mounting surface of the light source circuit boards and another member, and in addition helps prevent the light from the light-emitting elements from leaking through the gap between the relay connector and the other member.

Advantageous Effects of the Invention

According to the present invention, via a relay connector provided with a first coupling portion coupleable to a coupling portion of one circuit board and a second coupling portion coupleable to a coupling portion of another circuit board, the two circuit boards can be indirectly coupled together. This helps prevent an unnecessary space from being left between the circuit boards.

BRIEF DESCRIPTION OF DRAWINGS

FIG. 1 is a schematic top view of a light source module provided with a relay connector according to a first embodiment;

FIG. 2 is a schematic front view of a light source module provided with a relay connector according to the first embodiment;

FIG. 7 is a schematic front view of a light source module provided with a relay connector according to the second embodiment;

FIG. 8 is a top view of a relay connector according to the second embodiment;

FIG. 9 is a front view of a relay connector according to the second embodiment;

FIG. 10 is a left side view of a relay connector according to the second embodiment;

FIG. 11 is a right side view of a relay connector according to the second embodiment;

DESCRIPTION OF EMBODIMENTS

First Embodiment

Figure 3:
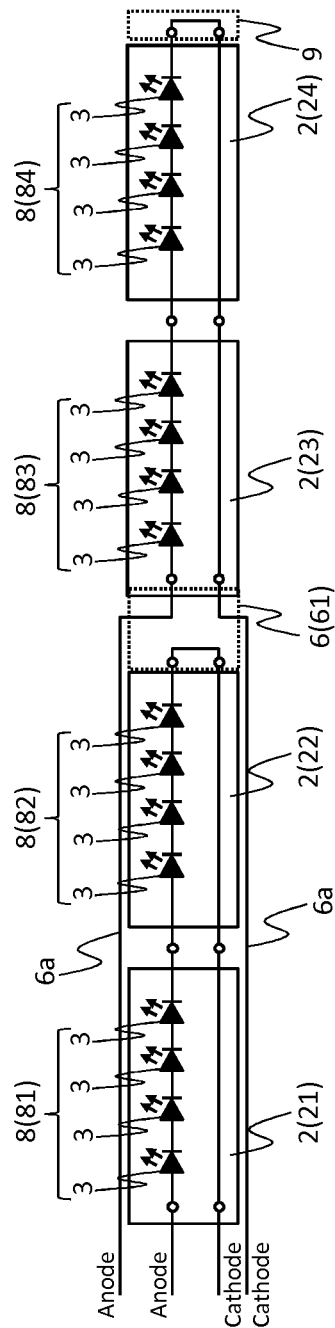
FIG. 3 is a diagram showing an example of the circuit configuration of a light source module provided with a relay connector according to the first embodiment.

Hereinafter, embodiments of the present invention will be described with reference to the accompanying drawings FIG. 1 is a schematic top view of a light source module provided with a relay connector according to this embodiment. FIG. 2 is a schematic front view of a light source module provided with a relay connector according to this embodiment. As shown in FIGS. 1 and 2, the light source module 1 is provided with four LED circuit boards (light source circuit boards) 2 (21 to 24) and a relay connector 6. On each LED circuit board 2, one or more (in FIGS. 1 and 2, four) LEDs 3 are mounted. Each LED circuit board 2 is provided with, at one end, a plug 4 and, at the other end, a receptacle 5.

The plug 4 of one LED circuit board 2 can be coupled to the receptacle 5 of another LED circuit board 2. There is no restriction on the coupling method. For example, the receptacle 5 has an opening, and inserting the plug 4 in the opening allows one LED circuit board 2 (for example, the LED circuit board 21) and another LED circuit board 2 (for example, the LED circuit board 22) to be mechanically and electrically coupled together. In FIG. 1, the plug 4 of the LED circuit board 21 is coupled to the receptacle 5 of the LED circuit board 22 to form one channel, and the plug 4 of the LED circuit board 23 is coupled to the receptacle 5 of the LED circuit board 24 to form one channel.

The plug 4 of the LED circuit board 22 and the receptacle 5 of the LED circuit board 23 are coupled together via the relay connector 6 (which will be described in detail later), and thereby the two channels are mechanically coupled together. To the plug 4 of the LED circuit board 24, a terminator 9 is mechanically and electrically coupled. To the receptacle 5 of the LED circuit board 21, a harness plug 7 is mechanically and electrically coupled. Via the relay connector 6 and the harness plug 7, an anode terminal and a cathode terminal of a serial circuit are led out to be connected to a constant-current source (not shown).

As described above, when the plug 4 of one LED circuit board 2 and the receptacle 5 of another LED circuit board 2 are directly coupled together, the one LED circuit board 2 and the other LED circuit board 2 are mechanically and electrically coupled together. FIG. 3 is a diagram showing an example of the circuit configuration of a light source module provided with a relay connector according to this embodiment. In FIG. 3, the LED circuit boards 21 and 22 are mechanically and electrically coupled together to form one channel, and the LED circuit boards 23 and 24 are mechanically and electrically coupled together to form one channel. On each LED circuit board 2, four LEDs 3 are stacked in series to form an LED string 8 (81 to 84). In each channel, a plurality of LED strings 8 are connected in series (a serially-connected electrical circuit configuration as mentioned earlier).

The relay connector 6 is coupled, at one end, to the plug 4 of the LED circuit board 22 and, at the other end, to the receptacle 5 of the LED circuit board 23. The relay connector 6 couples together, indirectly and mechanically via itself, the LED circuit boards 22 and 23, but does not electrically couple together the plug 4 of the LED circuit board 22 and the receptacle 5 of the LED circuit board 23.

The relay connector 6 forms part of a serial circuit which serially connects together the LED string 81 of the LED circuit board 21 and the LED string 82 of the LED circuit board 22, which together form one channel. Moreover, the relay connector 6, along with the terminator 9, forms part of a serial circuit which serially connects together the LED string 83 of the LED circuit board 23 and the LED string 84 of the LED circuit board 24, which together form one channel. The relay connector 6 is provided with two wire harnesses 6a (an electrical signal conducting member) which are led out of the relay connector 6, and is connected to an anode terminal and a cathode terminal of a serial circuit.

In the channel formed by the LED circuit boards 21 and 22, to the receptacle 5 of the LED circuit board 21, the harness plug 7 is coupled, and to the plug 4 of the LED circuit board 22, the relay connector 6 is coupled. Via the harness plug 7, the anode terminal and the cathode terminal of the serial circuit including the LED strings 81 and 82 are led out to be connected to a constant-current source. Thus, the LED strings 81 and 82 are driven together.

In the channel formed by the LED circuit boards 23 and 24, to the receptacle 5 of the LED circuit board 23, the relay connector 6 is coupled, and to the plug 4 of the LED circuit board 24, the terminator 9 is coupled. Via the relay connector 6, the anode terminal and the cathode terminal of the serial circuit including the LED strings 83 and 84 are led out to be connected to a constant-current source. Thus, the LED strings 83 and 84 are driven together.

Figure 4:
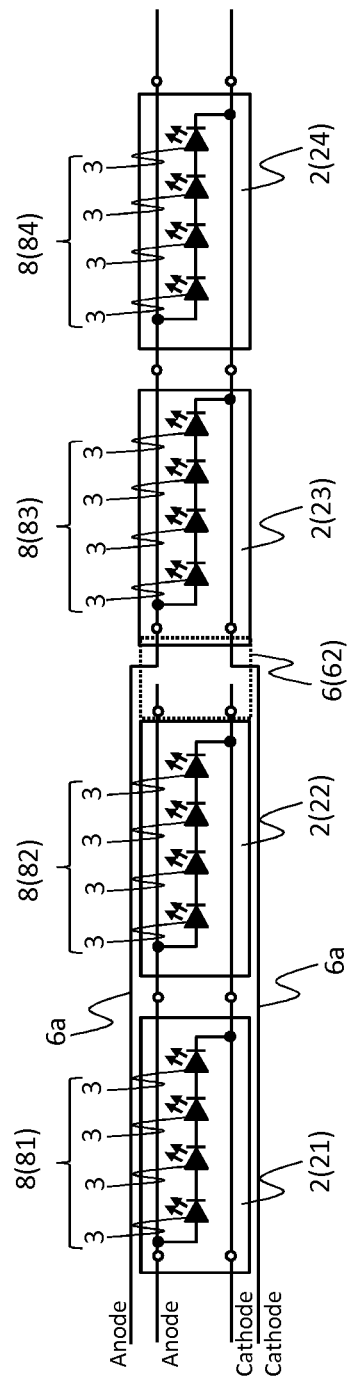
FIG. 4 is a diagram showing another example of the circuit configuration of a light source module provided with a relay connector according to the first embodiment.

FIG. 4 is a diagram showing another example of the circuit configuration of a light source module provided with a relay connector according to this embodiment. Differences from the circuit configuration shown in FIG. 3 lie in the electrical connection within the relay connector 6, and in that, in each channel, a plurality of LED strings are connected in parallel (a parallel-connected electrical circuit configuration as mentioned earlier). In terms of light source module configuration, this configuration is identical with the light source module configuration shown in FIGS. 1 and 2 except for omission of the terminator 9.

The relay connector 6 shown in FIG. 4 (in the following description, the relay connector shown in FIG. 3 is also referred to as the "relay connector 61," and the relay connector shown in FIG. 4 is also referred to as the "relay connector 62"), like the relay connector 61, couples together, indirectly and mechanically via itself, the LED circuit boards 22 and 23, but does not electrically couple together the plug 4 of the LED circuit board 22 and the receptacle 5 of the LED circuit board 23.

The relay connector 62 forms part of a parallel circuit which parallelly connects together the LED string 81 of the LED circuit board 21 and the LED string 82 of the LED circuit board 22, which together form one channel. The relay connector 62 forms part of a parallel circuit which parallelly connects together the LED stung 83 of the LED circuit board 23 and the LED string 84 of the LED circuit board 24, which together form one channel. The relay connector 62 is provided with two wire harnesses 6a (an electrical signal conducting member) led out of the relay connector 62, and is connected to the anode terminal and the cathode terminal of a serial circuit.

In the channel formed by the LED circuit boards 21 and 22, to the receptacle 5 of the LED circuit board 21, the harness plug 7 is coupled, and to the plug 4 of the LED circuit board 22, the relay connector 62 is coupled. Via the harness plug 7, the anode terminal and the cathode terminal of the parallel circuit including the LED strings 81 and 82 are led out to be connected to a constant-current source. Thus, the LED strings 81 and 82 are driven together.

In the channel formed by the LED circuit boards 23 and 24, to the receptacle 5 of the LED circuit board 23, the relay connector 62 is coupled, and to the plug 4 of the LED circuit board 24, the terminator 9 is coupled. Via the relay connector 62, the anode terminal and the cathode terminal of the parallel circuit including the LED strings 83 and 84 are led out to be connected to a constant-current source. Thus, the LED strings 83 and 84 are driven together.

According to this embodiment, via a relay connector, two circuit boards can be indirectly and mechanically coupled together. This helps prevent an unnecessary space from being left between the circuit boards.

Moreover, since the relay connector is provided with a wire harness (an electrical signal conducting member), no extra harness plug is needed, and therefore no space is needed for an extra harness plug.

Moreover, via the relay connector, it is possible to achieve indirect and mechanical coupling while simultaneously achieving electrical uncoupling (isolation). That is circuit boards belonging to different channels can be mechanically coupled together while being left electrically uncoupled from each other. This helps bring different channels physically closer together. Thus, even in a case where a light source module includes a large number of channels, the light source module is saved from becoming unduly large. This helps achieve size reduction in devices incorporating light source modules without losing safety and high quality (suppressed unevenness in luminance.

Second Embodiment

Figure 5:
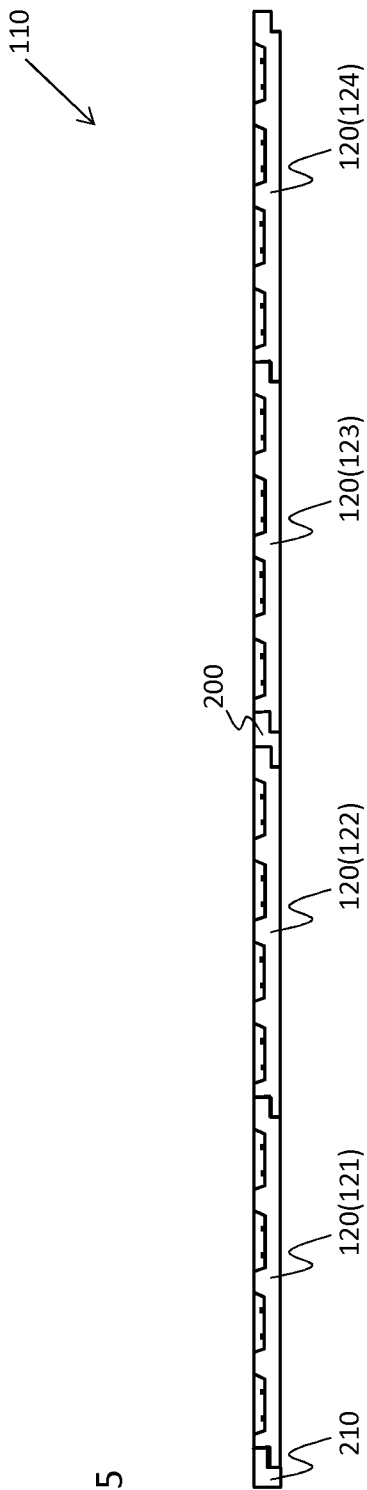
FIG. 5 is a schematic side view of a light source module provided with a relay connector according to a second embodiment.
Figure 6:
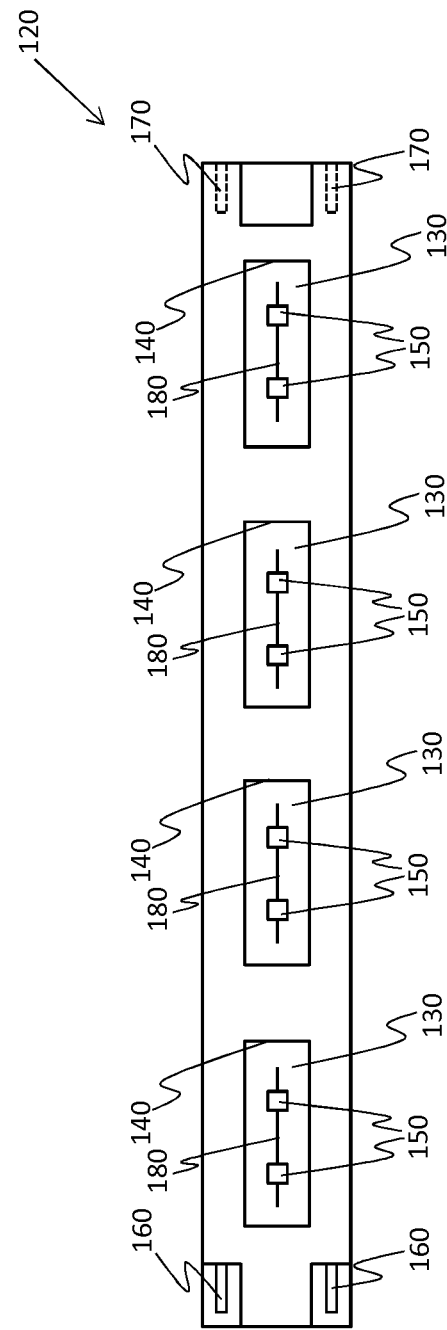
FIG. 6 is a schematic top view of a light source module provided with a relay connector according to the second embodiment.

FIG. 5 is a schematic side view of a light source module provided with a relay connector according to this embodiment. FIG. 6 is a schematic top vim of an LED circuit board provided in a light source module provided with a relay connector according to this embodiment. FIG. 7 is a schematic front view of an LED circuit board provided in a light source module provided with a relay connector according to this embodiment. This embodiment specifically deals with a case where the four LED circuit boards 2 in the first embodiment are LED circuit boards on which LEDs are mounted by a COB method (a method in which LEDs are mounted on LED circuit boards by being directly bonded thereto). The circuit configuration of the light source module is similar to that in the first embodiment (FIGS. 3 and 4), and therefore no overlapping description will be repeated in this connection.

As shown in FIG. 5, in this embodiment, the light source module 110 is provided with four LED circuit boards 120 (121 to 124), a harness plug 210, and a relay connector 200. As in the first embodiment, the relay connector 200 couples together, indirectly and mechanically via itself, a plug 160 provided on one LED circuit board 120 (122) and a receptacle 170 provided on another LED circuit board 120 (123). First, the LED circuit boards 120 will be described with reference to FIGS. 6 and 7.

As shown in FIGS. 6 and 7, each LED circuit board 120 is provided with a conductor layer 130 as an electrically conductive member within the LED circuit board 120, mounting pockets 140, one or more (in FIGS. 5 to 7, eight) LEDs 150, a plug 160 provided at one end of the LED circuit board 120, and a receptacle 170 provided at the other end of the LED circuit board 120.

Each mounting pocket 140 is a recess in the surface of the LED circuit board 120, and by forming a resin layer 141 inside the mounting pocket 140, the conductor layer 130 and two LEDs 150 mounted on the conductor layer 130 are sealed in. The resin layer can contain a phosphor (fluorescent or phosphorescent substance); for example, it can contain a phosphor that emits white light when excited by the LEDs. Any kind of phosphor can be used in any amount.

The LEDs 150 are directly die-bonded to the conductor layer 130, and electrical connection between the LEDs 150 themselves and between each LED 150 and the conductor layer 130 is achieved via boding wires 180.

The plug 160 of one LED circuit board 120 and the receptacle 170 of another LED circuit board 120 can be coupled together. When the plug 160 and the receptacle 170 are coupled together, the two LED circuit boards 120 are mechanically and electrically coupled together.

Next, the relay connector provided in the light source module of this embodiment will be described in detail. FIG. 8 is a top view of a relay connector according to this embodiment. FIG. 9 is a front view of a relay connector according to this embodiment. FIG. 10 is a left side view of a relay connector according to this embodiment. FIG. 11 is a right side view of a relay connector according to this embodiment. For convenience' sake, in the description of this and succeeding embodiments, the "left" and "right" sides refer to the left and right sides, respectively, as viewed from an observer standing opposite a front view (in this embodiment, FIG. 9).

As shown in FIGS. 8 to 11 the relay connector 200 has a body portion 201, a first coupling portion 202, and a second coupling portion 203. The first coupling portion 202 engages with a receptacle 170 to achieve mechanical coupling, and the second coupling portion 203 engages with a plug 160 to achieve mechanical coupling. The electrical connection within the relay connector 200 can be similar to that in the first embodiment. Specifically, as in FIG. 5, the relay connector 200 can couple together, indirectly and mechanically via itself, the plug 160 of the LED circuit board 122 and the receptacle 170 of the LED circuit board 123, while leaving the LED circuit boards 122 and 123 electrically uncoupled from each other.

This embodiment brings about similar effects as the first embodiment. In addition, suitable applications are found even in LED circuit boards adopting a COB method (where light-emitting elements are mounted on them by a COB method).

Third Embodiment

Figure 12:
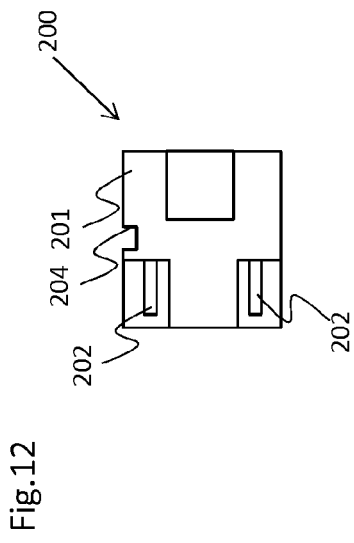
FIG. 12 is a top view of a relay connector according to a third embodiment.

FIG. 12 is a top view of a relay connector according to this embodiment. This embodiment deals with a modified example of the relay connector according to the second embodiment described above. As shown in FIG. 12, in this embodiment, the relay connector 200 additionally has an engagement portion 204 formed by cutting out part of the rear surface. On the other hand, on a housing of an unillustrated liquid crystal display device, an engagement portion is provided which engages with the engagement portion 204.

Thus, when a light source module 110 provided with the relay connector 200 according to this embodiment is built in a liquid crystal display device, a lighting device, or the like, the engagement portion on the liquid crystal display device engages with the engagement portion 204, and thereby the liquid crystal display module is positioned. Although in this embodiment the engagement portion 204 is formed in the rear surface of the relay connector 200, this is not meant as any limitation. The engagement portion 204 can be provided anywhere else so long as it does not interfere with the function of the relay connector 200 (mechanically connecting circuit boards together while electrically leaving them uncoupled from each other).

Although in this embodiment the engagement portion 204 is formed by cutting out part of the relay connector 200, this is not meant as any limitation. The engagement portion 204 can be formed as a projection that engages with an engagement portion formed in the liquid crystal display device by cutting out part of it.

This embodiment brings about similar effects as the second embodiment. In addition, when a relay connector is built in a device such as a liquid crystal display device having an engagement portion that engages with the engagement portion of the relay connector, the engagement portion of the relay connector engages with the engagement portion of the device. This helps achieve easy positioning of a light source module provided with the relay connector inside the device.

Fourth Embodiment

Figure 13:
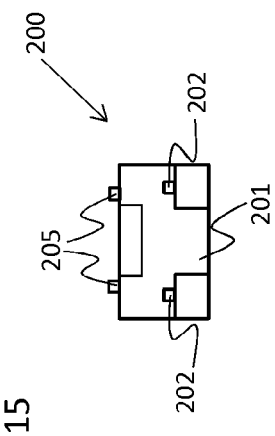
FIG. 13 is a top view of a relay connector according to a fourth embodiment.
Figure 14:
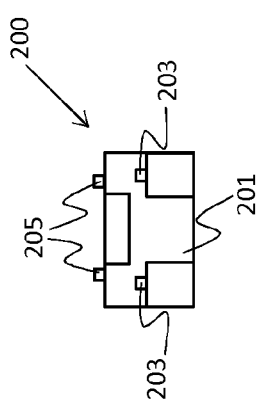
FIG. 14 is a front view of a relay connector according to the fourth embodiment.
Figure 15:
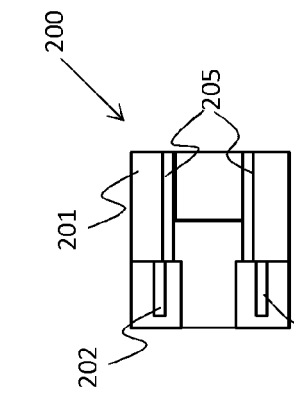
FIG. 15 is a left side view of a relay connector according to the fourth embodiment.
Figure 16:
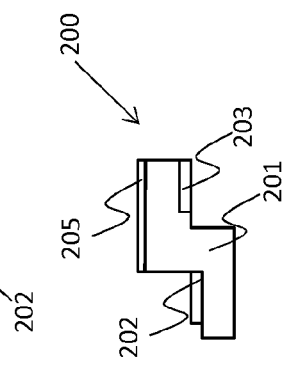
FIG. 16 is a right side view of a relay connector according to the fourth embodiment.

FIG. 13 is a top view of a relay connector according to this embodiment. FIG. 14 is a front view of a relay connector according to this embodiment. FIG. 15 is a left side view of a relay connector according to this embodiment. FIG. 16 is a right side view of a relay connector according to this embodiment. This embodiment deals with another modified example of the relay connector according to the second embodiment described above.

As shown in FIGS. 13 to 16, in this embodiment, the relay connector 200 has a projecting portion 205 on part of its top surface. The relay connector 200 according to this embodiment is particularly effective in a case where the light source module 110 is built in an edge-lit liquid crystal display device.

In an edge-lit liquid crystal display device, the light emitted from the light source module 110 needs to be shone, as backlight, over the entire screen of the liquid crystal display device. To that end, a light guide plate is arranged behind the screen (liquid crystal layer) of the liquid crystal display device, and the LED circuit boards 120 are arranged such that their mounting surface faces a side face of the light guide plate, so that the entire liquid crystal layer is irradiated with light. To efficiently use the light from the light source module 110 as backlight, it is preferable to minimize the physical distance between the light guide plate and the mounting surface of the LED circuit board 120s. On the other hand, it is also necessary to prevent contact between the light guide plate and the light source module 110 to prevent damage to the LEDs 150 and to the LED circuit board 120s.

Accordingly, in this embodiment, the relay connector 200 has the projecting portion 205 on its surface facing the light guide plate so as to leave a predetermined gap between the light source module 110 and the light guide plate. This helps bring the light source module 110 and the light guide plate closer together without contact between them.

In the relay connector 200 according to this embodiment, the projecting portion 205 comprises two projecting portions 205a and 205b formed apart from each other, parallel to the coupling direction of the LED circuit boards 120. This prevents the light from the light source module 110 from leaking out through the gap between the relay connector 200 and the light guide plate, and helps achieve efficient use of the light of the light source module 110.

Although in this embodiment the projecting portion 205 is provided to secure a predetermined gap between the relay connector 200 and the light guide plate, the member at the other end is not limited to a light guide plate. That is, the projecting portion 205 can be provided to secure a predetermined gap between the relay connector 200 and any other member.

This embodiment brings about similar effects as the first and second embodiments. In addition, it is possible to efficiently use the light of the light source module while preventing damage to the LED circuit boards and to the LEDs mounted on the LED circuit boards.

Figure 17:
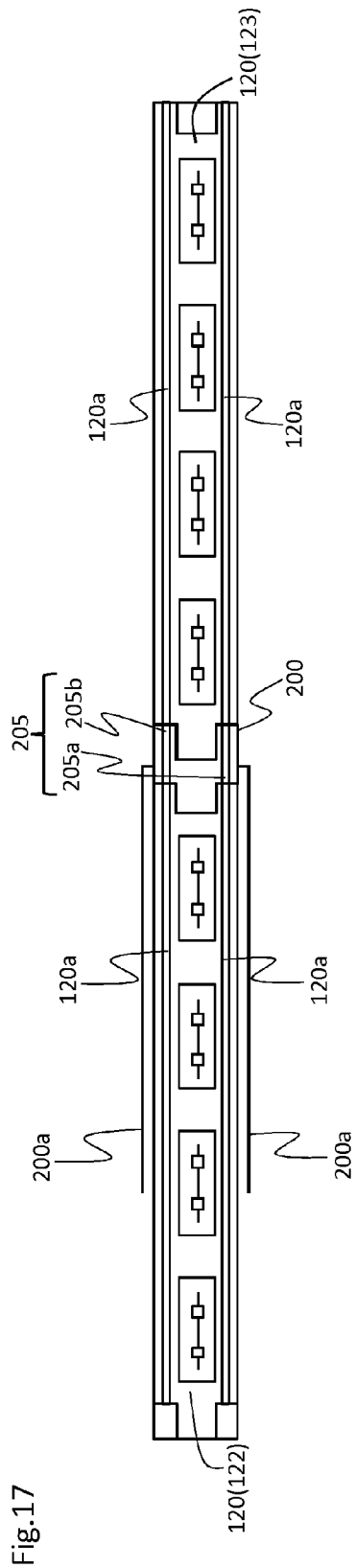
FIG. 17 is a schematic top view of part of a light source module provided with a relay connector according to the fourth embodiment.

In this embodiment, each LED circuit board 120 can further have projecting portions 120a (see FIG. 17) such that two projecting portions 120a are formed apart from each other across the LEDs 150 (so as to sandwich the LEDs 150), parallel to the coupling direction of the LED circuit boards 120. This configuration prevents the light from the light source module 110 from leaking out through the gap between the LED circuit boards 120 and the light guide plate, and helps achieve efficient use of the light of the light source module 110.

<Supplementary Notes>

The embodiments described above can be combined in any way. For example, the relay connector 200 can be provided with both the engagement portion 204 for positioning and the projecting portion 205 for securing a gap against another member. Although the relay connectors 200 according to the third and fourth embodiments described above are dealt with as modified example of the relay connector 200 according to the second embodiment, needless to say, such modifications can be applied to the relay connector 6 according to the first embodiment.

INDUSTRIAL APPLICABILITY

The present invention finds applications in relay connectors for coupling together a plurality of circuit boards having light-emitting elements mounted thereon, and in light source modules provided with such relay connectors.

LIST OF REFERENCE SIGNS 1, 110 light source module
2, 120 LED circuit board (light source circuit board)
3, 150 LED (light-emitting element
4, 160 plug
5, 170 receptacle
6, 200 relay connector
6a, 200a wire harness (electrical signal conducting member)
7, 210 harness plug
8 LED string
9 terminator
202 first coupling portion
203 second coupling portion
204 engagement portion
205 projecting portion

The invention claimed is:
1. A relay connector, comprising:
a first coupling portion mechanically coupleable to and decoupleable from a coupling portion of one circuit board out of two separate circuit boards respectively having mutually coupleable coupling portions such that, when the coupling portions are directly and mechanically coupled together, the two separate circuit boards are electrically and mechanically connected together; and a second coupling portion mechanically coupleable to and decoupleable from a coupling portion of the other circuit board out of the two separate circuit boards, wherein the relay connector is interposed between the two separate circuit boards to indirectly and mechanically couple together the two separate circuit boards, and when the coupling portion of one circuit board and the first coupling portion are coupled together and the coupling portion of the other circuit board and the second coupling portion are coupled together, the two separate circuit boards are electrically uncoupled from each other.

2. The relay connector according to claim 1, further comprising:

an electrical signal conducting member for input of an electrical signal from outside and/or for output of an electrical signal to outside.

3. The relay connector according to claim 1, further comprising:

an engagement portion for positioning.

4. The relay connector according to claim 1, further comprising:

a projecting portion for securing a gap against another member.

5. The relay connector according to claim 4, wherein the projecting portion comprises a first projecting portion and a second projecting portion formed apart from each other, parallel to a coupling direction of the two separate circuit boards.

6. A light source module comprising:

the relay connector according to claim 1; and two separate circuit boards having light-emitting elements mounted thereon and indirectly and decoupleably coupled together by the relay connector.

7. The light source module according to claim 6, wherein the two separate circuit boards indirectly coupled together by the relay connector are light source circuit boards on which light-emitting elements are mounted by a COB method.

8. The light source module according to claim 7, wherein the light source circuit boards comprise a first projecting portion and a second projecting portion formed apart from each other across the light-emitting elements, parallel to a coupling direction of the two circuit boards.

* * * * *